(12) United States Patent
Nguyen et al.

(10) Patent No.: US 10,797,002 B2
(45) Date of Patent: Oct. 6, 2020

(54) SPUTTERING SYSTEMS AND METHODS FOR PACKAGING APPLICATIONS

(71) Applicant: SKYWORKS SOLUTIONS, INC., Woburn, MA (US)

(72) Inventors: Hoang Mong Nguyen, Fountain Valley, CA (US); Matthew Sean Read, Foothill Ranch, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 15/420,293

(22) Filed: Jan. 31, 2017

(65) Prior Publication Data

US 2017/0221836 A1 Aug. 3, 2017

Related U.S. Application Data

(60) Provisional application No. 62/289,314, filed on Jan. 31, 2016.

(51) Int. Cl.
*H01L 23/552* (2006.01)
*C23C 14/50* (2006.01)
(Continued)

(52) U.S. Cl.
CPC .......... *H01L 23/552* (2013.01); *C23C 14/50* (2013.01); *C23C 14/54* (2013.01); *H01L 21/2855* (2013.01); *H01L 21/6836* (2013.01)

(58) Field of Classification Search
CPC .......... H01L 21/0228; H01L 21/68764; H01L 21/68771; H01L 21/02164;
(Continued)

(56) References Cited

U.S. PATENT DOCUMENTS

| 4,143,297 A | * | 3/1979 | Fischer | ................. | H05B 33/12 |
| | | | | | 313/502 |
| 6,884,313 B2 | * | 4/2005 | Liu | .......................... | B32B 7/12 |
| | | | | | 156/155 |

(Continued)

OTHER PUBLICATIONS

International Search Report dated Jun. 7, 2017 for PCT/US2017/015735.
Written Opinion dated Jun. 5, 2017 for PCT/US2017/015735.

*Primary Examiner* — Jarrett J Stark
(74) *Attorney, Agent, or Firm* — Chang & Hale LLP

(57) ABSTRACT

Sputtering systems and methods for packaging applications. In some embodiments, a method for processing a plurality of packaged devices can include forming or providing a first assembly having a stencil and a two-sided adhesive member attached to a first side of the stencil, with the stencil having a plurality of openings, and the two-sided adhesive member having a plurality of openings corresponding to the openings of the stencil. The method can further include attaching the first assembly to a ring to provide a second assembly, with the ring being dimensioned to facilitate a deposition process. The method can further include loading a plurality of packaged devices onto the second assembly such that each packaged device is held by the two-sided adhesive member of the first assembly and a portion of each packaged device extends into the corresponding opening of the two-sided adhesive member.

13 Claims, 13 Drawing Sheets

(51) Int. Cl.
*H01L 21/285* (2006.01)
*H01L 21/683* (2006.01)
*C23C 14/54* (2006.01)

(58) Field of Classification Search
CPC ......... H01L 21/02274; H01L 21/32136; H01L 21/0254; H01L 21/6719; H01L 21/02104; H01L 21/0337; H01L 23/552; H01L 21/2855; H01L 2224/96; H01L 23/3121; H01L 21/561; H01L 2221/68359; H01L 2224/04105; C23C 14/50; C23C 14/54
See application file for complete search history.

(56) References Cited

U.S. PATENT DOCUMENTS

| | | | |
|---|---|---|---|
| 8,993,358 B2* | 3/2015 | Mei | H01L 33/50 438/28 |
| 9,297,072 B2* | 3/2016 | Kato | C23C 16/402 |
| 2003/0099097 A1* | 5/2003 | Mok | G01R 1/06716 361/767 |
| 2003/0194835 A1* | 10/2003 | Kim, II | H01L 23/24 438/113 |
| 2005/0269682 A1 | 12/2005 | Onodera et al. | |
| 2006/0043364 A1 | 3/2006 | Jiang et al. | |
| 2009/0087938 A1* | 4/2009 | Ramappa | B81C 99/0055 438/49 |
| 2011/0115060 A1 | 5/2011 | Chiu et al. | |
| 2014/0011369 A1* | 1/2014 | Kato | H01L 21/02233 438/771 |
| 2014/0044516 A1 | 2/2014 | Sanchez et al. | |
| 2015/0325548 A1 | 11/2015 | Read | |
| 2016/0111375 A1* | 4/2016 | Bair | H01L 23/552 438/110 |
| 2017/0015548 A1* | 1/2017 | Mao | B81C 1/00873 |
| 2017/0221836 A1* | 8/2017 | Nguyen | C23C 14/50 |
| 2017/0317710 A1* | 11/2017 | Liu | H04B 1/48 |
| 2017/0352643 A1* | 12/2017 | Read | H01L 23/552 |

* cited by examiner

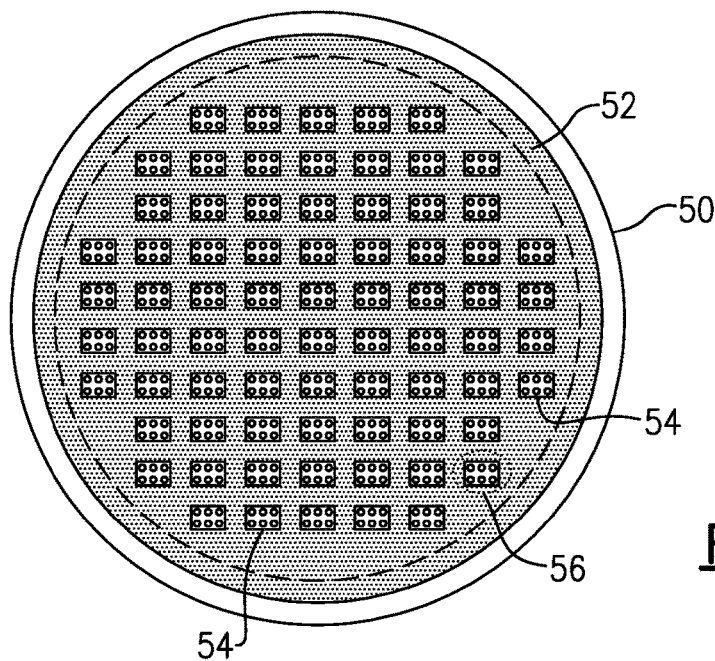
FIG.1
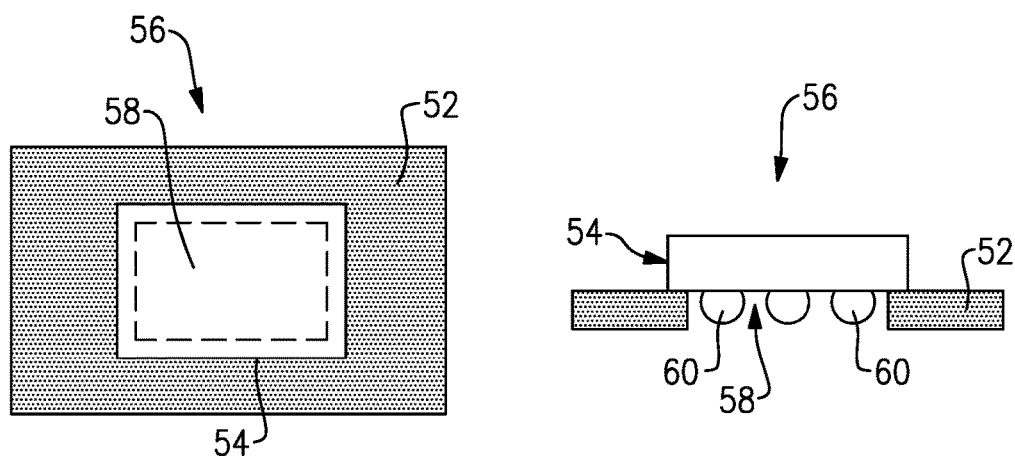
FIG.2A
FIG.2B

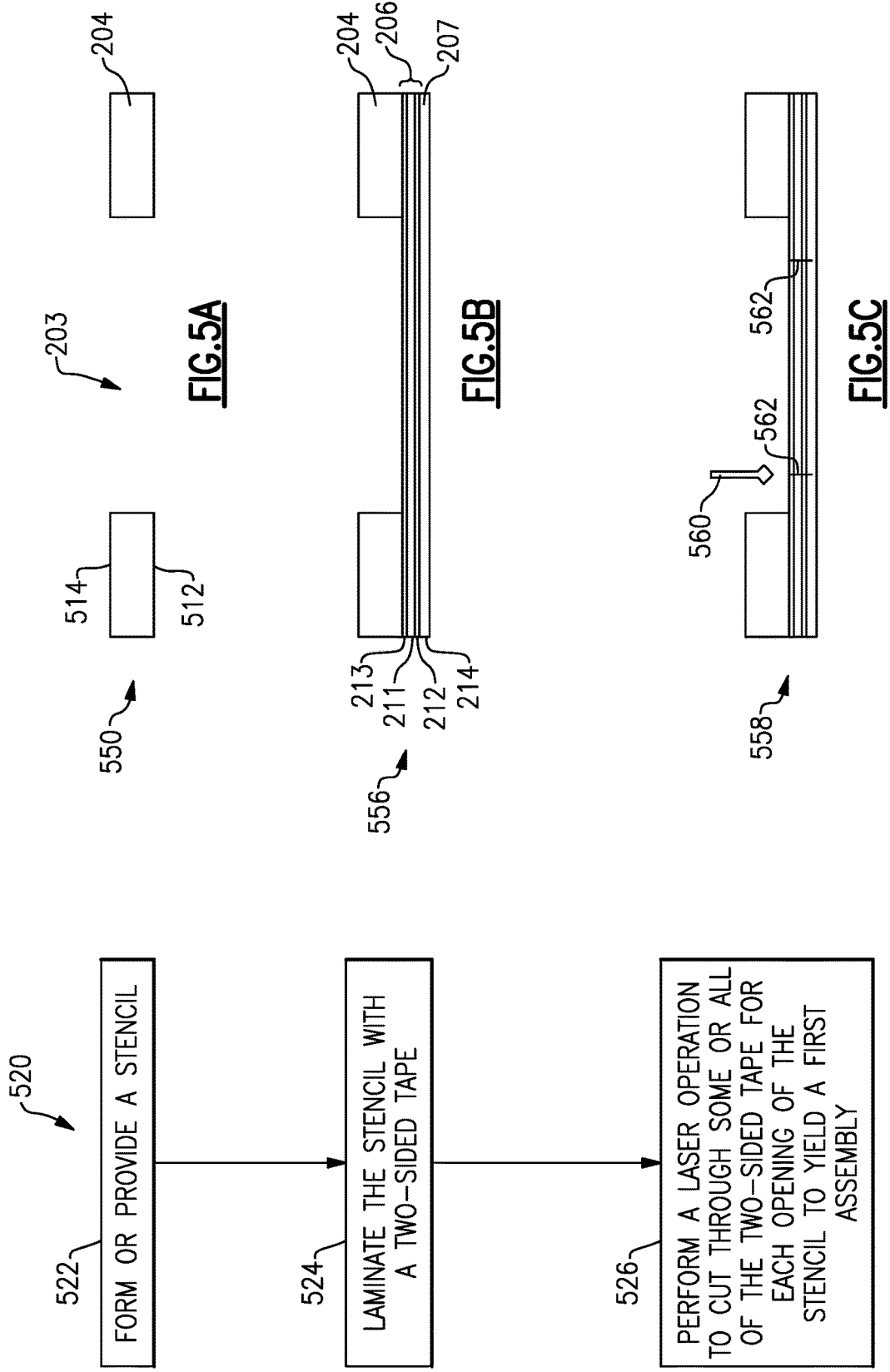

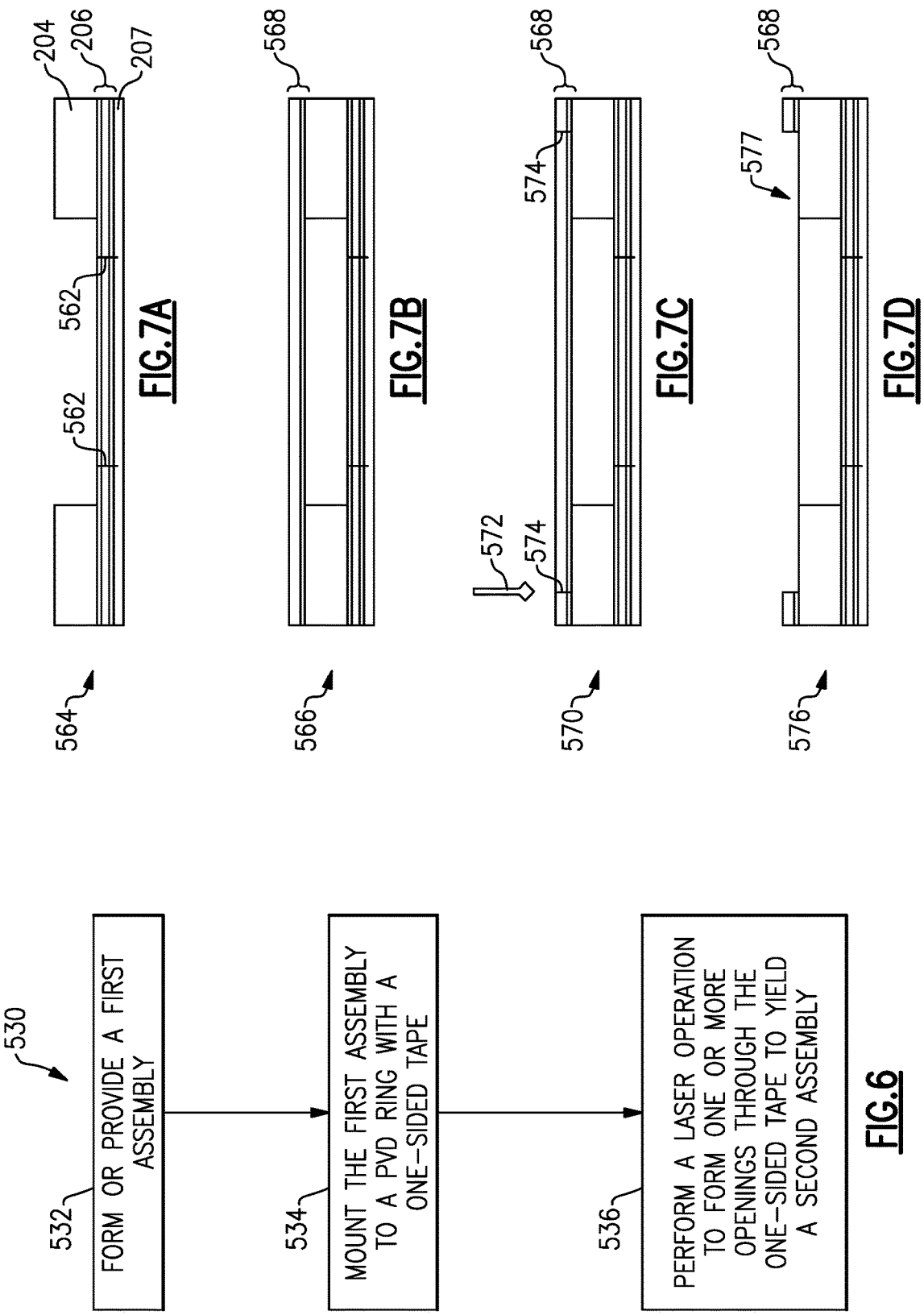

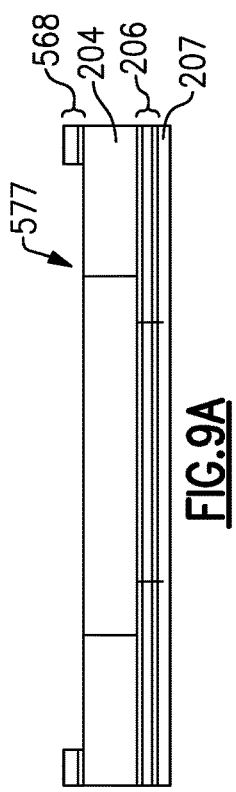
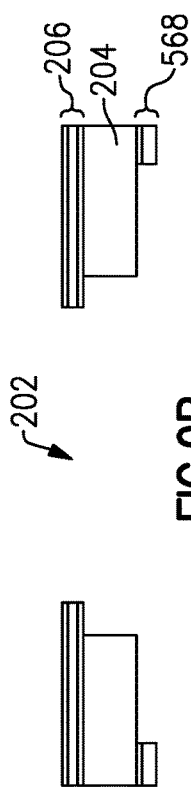
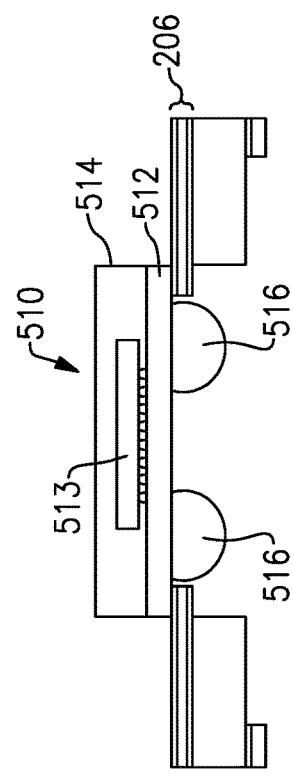
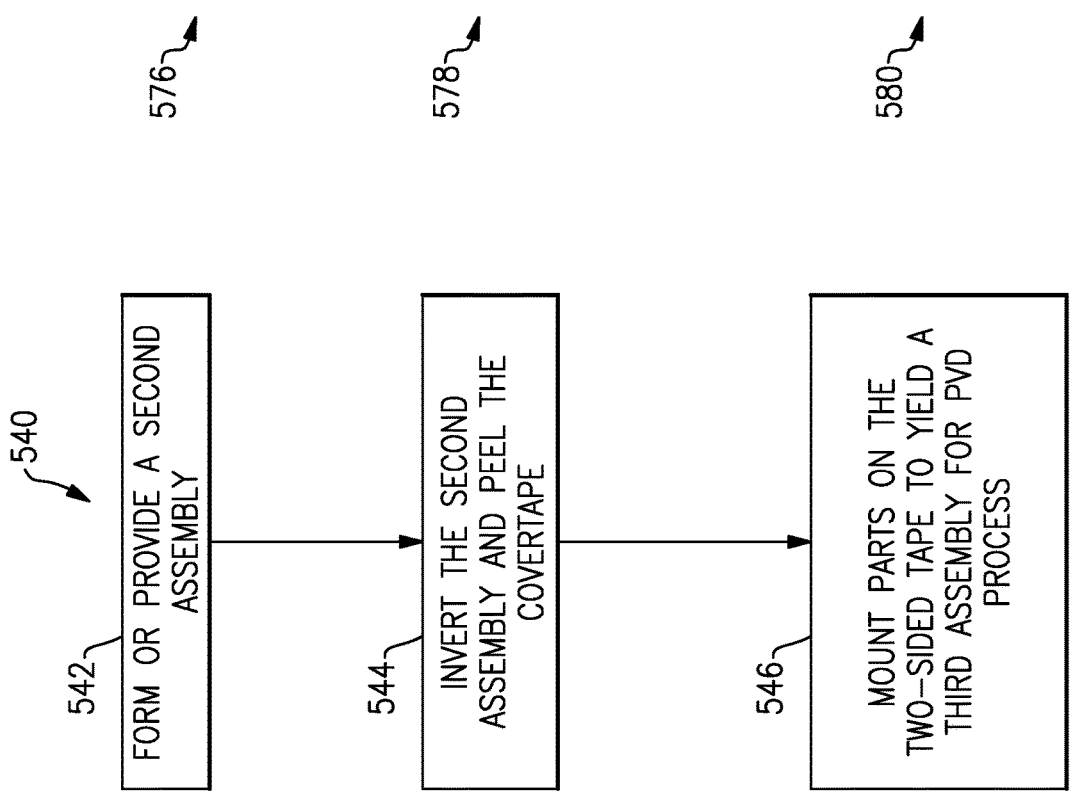

SPUTTERING SYSTEMS AND METHODS FOR PACKAGING APPLICATIONS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims priority to U.S. Provisional Application No. 62/289,314 filed Jan. 31, 2016, entitled SPUTTERING SYSTEMS AND METHODS FOR PACKAGING APPLICATIONS, the disclosure of which is hereby expressly incorporated by reference herein in its respective entirety.

BACKGROUND

Field

The present disclosure relates to fabrication of packaged electronic modules such as shielded radio-frequency (RF) modules.

Description of the Related Art

In radio-frequency (RF) applications, RF circuits and related devices can be implemented in a packaged module. Such a packaged module can include shielding functionality to inhibit or reduce electromagnetic interference associated with some or all of such RF circuits.

SUMMARY

In accordance with a number of implementations, the present disclosure relates to a method for processing a plurality of packaged devices. The method includes forming or providing a first assembly having a stencil and a two-sided adhesive member attached to a first side of the stencil. The stencil has a plurality of openings, and the two-sided adhesive member has a plurality of openings corresponding to the openings of the stencil. The method further includes attaching the first assembly to a ring to provide a second assembly, with the ring being dimensioned to facilitate a deposition process. The method further includes loading a plurality of packaged devices onto the second assembly such that each packaged device is held by the two-sided adhesive member of the first assembly and a portion of each packaged device extends into the corresponding opening of the two-sided adhesive member.

In some embodiments, each packaged device can include a box-shaped body, and the portion of the packaged device extending into the corresponding opening of the two-sided adhesive member can include one or more features implemented on an underside of the box-shaped body. The one or more features can include a plurality of solder balls. The box-shaped body can include an upper surface and four side wall surfaces. The method can further include performing the deposition process on the second assembly loaded with the packaged devices such that an electrically conductive material is deposited onto the upper surface and four side wall surfaces of the box-shape body of each of the plurality of packaged devices.

In some embodiments, the electrically conductive material can be deposited in a conformal manner. In some embodiments, the packaged device can be a radio-frequency module, and the electrically conductive material can be configured to provide shielding for the radio-frequency module.

In some embodiments, the forming of the first assembly can include attaching the two-sided adhesive member without the openings to the first side of the stencil, and performing a laser cutting operation to form the openings of the two-sided adhesive member. The laser cutting operation can be performed such that a laser beam is incident on the two-sided adhesive member through the opening of the stencil. The laser cutting operation can be further configured such that the laser beam cuts through the two-sided adhesive member but not through a cover layer on the side of the two-sided adhesive member opposite from the stencil. The method can further include removing the cover layer from the two-sided adhesive member such that the cut portion of the two-sided adhesive member is removed with the cover layer to thereby provide the opening of the two-sided adhesive member. The removing of the cover layer can be performed after the attaching of the first assembly to the ring. The opening of the two-sided adhesive member can be smaller than the corresponding opening of the stencil.

In some embodiments, the attaching of the first assembly to the ring can include positioning the first assembly relative to the ring such that the ring encircles the first assembly. The attaching of the first assembly to the ring can further include positioning an adhesive member on the first assembly and the ring to thereby secure the first assembly to the ring, with the adhesive member being attached to a second side of the stencil. The adhesive member can be a one-sided adhesive member. The method can further include performing a laser cutting operation to cut through a portion of the adhesive member covering the stencil to expose at least a portion of each opening of the stencil. The cut through the portion of the adhesive member can result in a single opening in the adhesive member to expose all of the openings of the stencil. The laser cutting operation can be performed such that a laser beam cuts through the adhesive member and does not damage the two-sided adhesive member on the first side of the stencil. The laser cutting operation can be performed such that the laser beam is blocked by the stencil after cutting through the adhesive member.

In some implementations, the present disclosure relates to a device for processing a plurality of packaged modules. The device includes a ring configured to be utilized in a deposition apparatus, and a stencil having a plurality of openings, with each opening dimensioned to receive a portion of a packaged module to be processed. The device further includes an adhesive member that attaches the stencil to the ring to allow the stencil to be utilized in the deposition apparatus.

In some embodiments, the device can further include a two-sided adhesive member attached to a first side of the stencil, with the two-sided adhesive member having a plurality of openings corresponding to the openings of the stencil. The ring and the stencil can be attached by the adhesive member to be approximately co-planar. The stencil can be positioned within an inner radius of the ring. The adhesive member can be dimensioned to cover at least a portion of a second side of the stencil and at least a portion of a corresponding side of the ring. The adhesive member can be a one-sided adhesive member such that an adhesive side of the one-sided adhesive member engages the second side of the stencil and the corresponding side of the ring.

In some embodiments, the adhesive member can includes one or more cutouts dimensioned to expose at least a portion of each opening of the stencil on the second side of the stencil to allow ambient gas to escape from the opening of the stencil when the portion of the RF module is placed therein from the first side of the stencil. The one or more cutouts of the adhesive member can include a single cutout that exposes all of the openings of the stencil, with the single cutout resulting in the adhesive member holding the second side of the stencil at a perimeter portion of the stencil.

In some embodiments, the single cutout of the adhesive member can includes a cut edge at a solid portion of the stencil such that the stencil inhibits damage to the two-sided adhesive member on the first side of the stencil during a cutting operation on the adhesive member from the second side of the stencil.

In some embodiments, each opening of the two-sided adhesive member on the first side of the stencil can be dimensioned to engage an underside of the packaged module while allowing the portion of the packaged module to enter the corresponding opening of the stencil. Each opening of the two-sided adhesive member on the first side of the stencil can be smaller than the corresponding opening of the stencil such that an edge of the opening of the two-sided adhesive member forms an overhang relative to an edge of the corresponding opening of the stencil.

In some embodiments, the device can further include a cover layer over the two-sided adhesive member, with the cover layer being configured to be removed prior to positioning of the packaged modules onto the two-sided adhesive member. The openings of the two-sided adhesive member can be configured so that when the cover layer is removed, a cutout of the two-sided adhesive member is removed with the cover layer to thereby provide the corresponding opening of the two-sided adhesive member.

In some embodiments, the ring can have a generally circular shape. The ring can be dimensioned to fully enclose its interior portion.

In some embodiments, the deposition apparatus can include a physical vapor deposition apparatus. In some embodiments, the stencil can be a rectangular shaped sheet, and the openings can be rectangular shaped openings arranged in an array.

According to some teachings, the present disclosure relates to a system for batch processing of packaged modules. The system includes a first sub-system configured to prepare or provide a carrier assembly that includes a ring configured to be utilized in a deposition apparatus, a stencil assembly having a plurality of openings, with each opening dimensioned to receive a portion of a packaged module to be processed, and an adhesive member that attaches the stencil assembly to the ring to allow the stencil assembly to be utilized in the deposition apparatus. The system further includes a second sub-system configured to handle a plurality of packaged modules, such that the packaged modules are capable of being positioned over the openings of the stencil assembly and held by the stencil assembly to thereby allow the plurality of packaged modules to be processed further in the deposition apparatus.

In some embodiments, the system can further include a third sub-system having the deposition apparatus and configured to perform a deposition process on the plurality of packaged modules. The packaged modules being held by the stencil assembly can allow the deposition process to deposit a conformal layer of conductive material on upper and side surfaces of each packaged module while maintaining an underside of the packaged module substantially free of the conductive material.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 1 shows an underside view of an example assembly that includes a ring having a tape attached to its underside, and an array of packaged devices mounted on the tape.

FIG. 2A shows an enlarged upper-side plan view of a portion of FIG. 1.

FIG. 2B shows an enlarged side sectional view of the same portion of FIG. 1.

FIG. 4 shows an example process where a two-sided tape is mated to a bare stencil to yield a first assembly.

FIGS. 5A-5C show example states associated with the process of FIG. 4.

FIG. 6 shows an example process where the first assembly of FIG. 4 is mounted to a PVD ring to yield a second assembly.

FIGS. 7A-7D show example states associated with the process of FIG. 6.

FIG. 8 shows an example process where the second assembly of FIG. 6 is prepared for loading of one or more packaged devices to yield a third assembly for a PVD process.

FIGS. 9A-9C show example states associated with the process of FIG. 8.

DETAILED DESCRIPTION OF SOME EMBODIMENTS

Figure 3A:
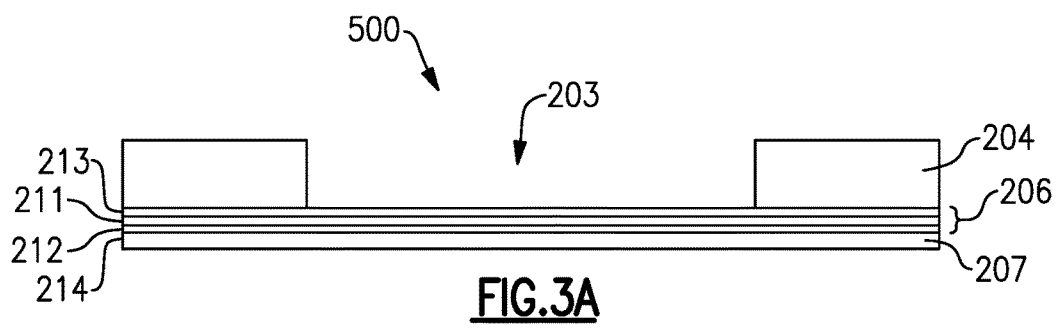
FIGS. 3A-3D show an example of how a stencil can be utilized to hold packaged devices for one or more processing steps.

The headings provided herein, if any, are for convenience only and do not necessarily affect the scope or meaning of the claimed invention.

FIG. 1 shows an underside view of an example assembly that includes a ring 50 having a tape 52 attached to its underside. A region of the tape 52 within the inner boundary of the ring 50 is shown to have mounted thereon an array of devices 54 such as packaged devices. The ring 50 can be dimensioned to be mounted on an apparatus such as, for example, a physical vapor deposition (PVD) machine, to allow a PVD process to be performed on the upper side of the assembly.

In the example of FIG. 1, a portion indicated as 56 and representative of a packaged device 54 and its relation to the tape 52, is shown in greater detail in FIGS. 2A and 2B. FIG. 2A shows an enlarged upper-side plan view of the portion 56 of FIG. 1, and FIG. 2B shows an enlarged side sectional view of the same portion 56. The packaged device 54 is shown to include one or more irregular features or topography such as solder balls 60. Such a packaged device is shown to be mounted onto the upper surface of the tape 52. As shown in FIG. 1, the upper surface of the peripheral portion of the tape 52 is also shown to be attached to the underside of the ring 50.

In the example shown in FIGS. 2A and 2B, the irregular features or topography such as the solder balls 60 are shown to be accommodated by an opening 58 defined by the tape 52. Accordingly, the packaged device 54 can be held by the tape 52 such that the side walls and the upper surface of the packaged device 54 are generally exposed to the upper side of the assembly. In such a configuration, a deposition process such as a PVD process performed on the upper side of the assembly can result in conformal coating of material (e.g., conductive material such as metal) onto the side walls and the upper side of the packaged device 54, while the lower side (including the solder balls 60) generally remains uncoated during the PVD process. As described herein, such conformal coating of the packaged device 54 can provide radio-frequency (RF) shielding functionality.

In the example of FIGS. 1 and 2, the tape 52 is typically sufficiently flexible such that mechanical issues may arise. For example, when the array of packaged devices 54 are loaded onto the tape 52, the extra weight may cause the tape 52 to sag and thereby deviated from a generally planar configuration of the assembly. Such sagging can affect uniformity of coating resulting from the PVD process. Such sagging can also impact how the packaged devices 54 are handled during the loading (e.g., before the PVD process) and unloading (e.g., after the PVD process) steps.

Described herein are various examples of how a stencil can be utilized to hold devices (e.g., packaged devices) during a packaging fabrication process (e.g., a PVD process to form a conformal shielding layer). Such a stencil can be configured to provide a more stable platform than the tape example of FIGS. 1 and 2, for holding of the devices to be worked on. As also described herein, such a stencil can be assembled with a device such as a PVD ring to yield an assembly that benefits from the stability of the stencil as well as being able to utilize an existing PVD machine.

Among others, various examples related to stencils for holding packaged devices are described in PCT Application No. PCT/US2016/054652 titled DEVICES AND METHODS RELATED TO FABRICATION OF SHIELDED MODULES which is expressly incorporated by reference in its entirely, and its disclosure is to be considered part of the specification of the present application. Among others, various examples related to packaged devices having irregular features such as solder balls are described in U.S. Publication No. 2016/0099192 titled DUAL-SIDED RADIO-FREQUENCY PACKAGE HAVING BALL GRID ARRAY which is expressly incorporated by reference in its entirely, and its disclosure is to be considered part of the specification of the present application.

It is noted that in some embodiments, a packaged device such as a dual-sided package having a ball grid array disclosed in U.S. Publication No. 2016/0099192 can be configured with a packaging substrate having conductive features exposed on its side walls. Such conductive features can be electrically connected to a ground plane within the packaging substrate. Thus, a conformal shielding layer formed as described herein on the upper surface and the side wall surfaces of the packaged device is electrically connected to the ground plane through the conductive features, to thereby provide RF shielding functionality for the packaged device.

FIGS. 3A-3D show an example of how one or more features described in PCT Application No. PCT/US2016/054652 can be implemented to hold packaged devices for processing step(s). For the purpose of description, it will be understood that terms such as stencil, frame carrier, and plate can be utilized interchangeably in appropriate circumstances. For example, a frame carrier or a plate as described in PCT Application No. PCT/US2016/054652 can be utilized as a stencil described herein. In another example, a stencil as described herein can be utilized as a frame carrier or a plate in PCT Application No. PCT/US2016/054652.

In some embodiments, a stencil having one or more features as described herein can be a plate having a first side through which individual units (e.g., singulated units) can be introduced to and removed from the stencil. The second side of the plate can be the side opposite from the first side. For example, if the stencil is utilized so that individual units are introduced to and removed from the stencil at the stencil's upper side, then the stencil's upper side can be its first side, and the underside can be its second side. Similarly, if the stencil is utilized so that individual units are introduced to and removed from the stencil at the stencil's lower side, then the stencil's underside can be its first side, and the upper side can be its second side.

In some embodiments, the plate of the foregoing stencil can define an array of apertures. Each of such apertures can be dimensioned to receive at least a portion of an individual unit, such that a plurality of such individual units can be arranged in an array for further processing. Such portion received by the stencil can include, for example, irregular features such as solder balls on an underside of an individual packaged device.

In some embodiments, the foregoing stencil can be, for example, a metal plate or a plate having composition that can handle repeated exposures to operating conditions such as cleaning environment and tape-cutting laser operations. Such a plate can be in, for example, a rectangular shaped panel format, and have an appropriate thickness to provide one or more functionalities as described herein.

In an example configuration 500 of FIG. 3A, a stencil 204 is shown to define an opening 203 dimensioned to receive a portion of a packaged device. Although one opening is shown for the purpose of description, it will be understood that a plurality of such openings can be implemented on the stencil 204. A double-sided tape 206 (also referred to herein as a two-sided tape) is shown to be attached to one side of the stencil 204. Such a tape can include, for example, a polymide film 211 (e.g., Kapton) base having an adhesive layer implemented on each side. Thus, in the example shown, an adhesive layer 213 is shown to engage the stencil 204, and an adhesive layer 212 is shown to be covered by a cover layer 207 (e.g., PET film). Accordingly, the cover layer 207 can be peeled off to expose the adhesive layer 212.

Figure 3B:
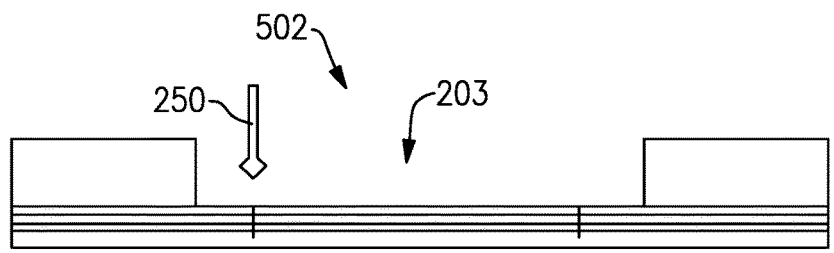

In the example configuration 502 of FIG. 3B, a laser beam 250 is shown to be applied to the two-sided tape 206 to form an opening through the two-sided tape 206. As described in PCT Application No. PCT/US2016/054652, such application of the laser beam 250 can be achieved in a number of ways. For example, the laser beam 250 can be applied from the underside (upper side in the inverted orientation of FIG. 3B), and the opening resulting from the laser cutting operation can result in an overhang of the two-sided tape 206 beyond each edge of the opening 203 of the stencil 204.

In some embodiments, the laser cutting operation of FIG. 3B can be configured such that the laser beam 250 generally burns through the two-side tape 206, but not completely through the cover layer 207. Thus, when the cover layer 207 is peeled from the two-sided tape 206, the cut portion of the two-sided tape 206 remains stuck to the cover layer 207 and thus be removed together.

Figure 3C:
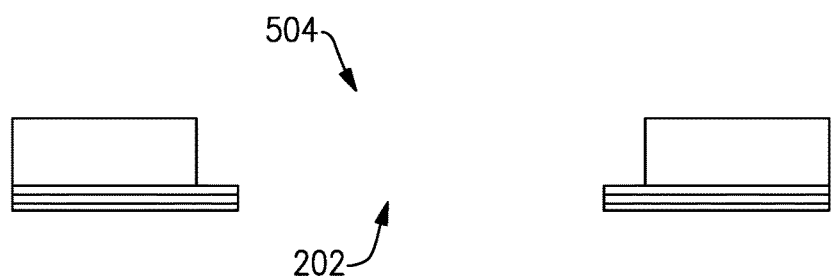

In the example configuration 504 of FIG. 3C, the laser cutting operation of FIG. 3B and the peeling of the cover layer are shown to yield an opening 202 through the two-sided tape. As described in PCT Application No. PCT/US2016/054652, such an opening can be dimensioned in different manners relative to the opening 203 of the stencil 204. In some embodiments, the opening 202 can be dimensioned so as to yield an overhang (when oriented as in FIG. 3D) of the two-sided tape 206 beyond the edge of the opening 203 of the stencil. In some processing applications, such an overhang of the two-sided tape can provide desirable functionalities when processing packaged devices. Examples related to such desirable functionalities are described herein in greater detail.

Figure 3D:
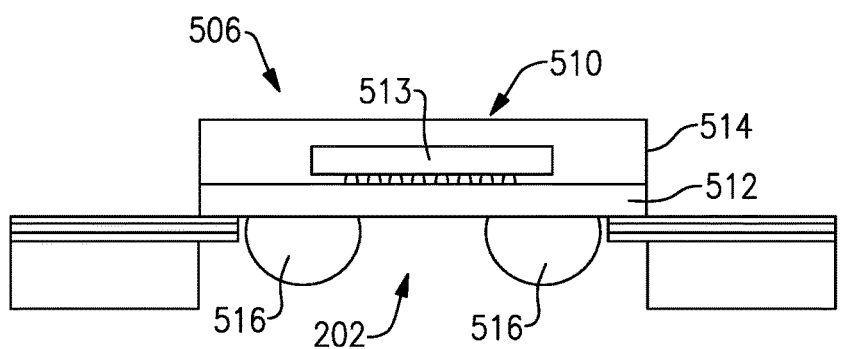

In the example configuration 506 of FIG. 3D, the assembly of FIG. 3C is shown to be inverted such that the two-sided tape 206 is over the stencil 204, with the adhesive layer 212 (as indicated in FIG. 3A) being exposed on top. On such oriented assembly, a packaged device 510 is shown to be mounted onto the two-sided tape 206, such that solder balls 516 extend through the opening 202 of the two-sided tape 206. Accordingly, the periphery of the underside of the package device 510 can be secured by the edge portion of the two-sided tape 206.

In the example of FIG. 3D, the packaged device 510 is shown to include a packaging substrate 512 (e.g., a PCB substrate, a laminate substrate, etc.), and a radio-frequency (RF) component 513 such as a die mounted on the packaging substrate 512. An overmold cap 514 can be formed over the packaging substrate 512 to yield an upper surface of the packaged device 510. In the example context of the packaging substrate 512 having a rectangular footprint shape, a box shape formed by the overmold cap 514 and the packaging substrate 512 defines four side walls of the packaged device 510. Accordingly, when the packaged device 510 is mounted on the two-sided tape 206 as shown in FIG. 3D, the four side walls and the upper surface of the packaged device 510 are exposed to allow deposition of material such as metal to provide RF shielding functionality. The underside of the packaged device 510, including the solder balls 516, is not exposed to the upper side of the stencil; thus, is not subjected to the deposition material.

In the example of FIG. 3D, the underside of the packaged device 510 may or may not include an underside-mounted component such as a die. Further, it will be understood that the solder balls 516 are examples of irregular features or topography associated with the example packaged device 510. Such irregular features or topography can include features other than or in addition to the solder balls. Examples related to the foregoing underside-mounted component and the irregular features or topography are described in U.S. Publication No. 2016/0099192.

In some manufacturing applications, it may be desirable to utilize an existing system such as a PVD system. As described in reference to FIGS. 1 and 2, a ring dimensioned for a PVD system can be utilized to mount an array of packaged devices by using a tape. However, such a configuration can yield one or more challenges due to, for example, flexibility of the tape.

In some embodiments, a stencil having one or more features as described herein can be implemented to specifically operate with a PVD system. Such a configuration can also face one or more challenges. For example, if the PVD-dedicated stencil is relatively large, there may be challenges in a laser system when making various cutting operations (e.g., through the two-sided tape).

Described herein are various examples of how a stencil can be mounted onto another structure (e.g., a PVD ring) so as to provide a number of advantageous features. For example, loading, processing, and unloading of packaged devices with the stencil can benefit due to stable and consistent property of the stencil. In another example, the stencil can be dimensioned appropriately to allow easier non-PVD operations such as laser-cutting operations.

In some embodiments, a stencil can be mounted onto a PVD ring by use of a tape. FIGS. 4 and 5 show an example process and example states associated with such a process, where a two-sided tape is mated to a bare stencil to yield a first assembly. FIGS. 6 and 7 show an example process and example states associated with such a process, where the first assembly of FIGS. 4 and 5 is mounted to a PVD ring to yield a second assembly. FIGS. 8 and 9 show an example process and example states associated with such a process, where the second assembly of FIGS. 6 and 7 is utilized for loading of one or more packaged devices to yield a third assembly for a PVD process. FIGS. 10-16 show additional examples related to the foregoing examples of FIGS. 4-9.

In various examples depicted in FIGS. 5, 7 and 9, one representative opening is shown for clarity. However, it will be understood that a stencil can include a plurality of such openings (e.g., arranged in an array) to accommodate a plurality of packaged devices.

It is noted that various examples are described in the context of a PVD process. However, it will be understood that one or more features of the present disclosure can also be implemented for other types of deposition or fabrication processes.

In some embodiments, one or more features of the present disclosure can be utilized to form a conformal conductive layer on each of an array of packaged devices to yield an RF shielding functionality for each packaged device. Such formation of conformal conductive layer on the packaged device can be achieved by PVD and/or other types of fabrication processes.

Referring to FIGS. 4 and 5, a process 520 can include a block 522 where a stencil is formed or provided. Such a stencil is depicted as 204 in a configuration 550 of FIG. 5A. The stencil 204 is shown to include a first surface 512 and a second surface 514. The stencil 204 is also shown to include an opening 203 dimensioned to receive a portion of a packaged device as described herein.

The process 520 can further include a block 524 where the stencil is laminated with a two-sided tape. Such a laminated configuration is depicted as 556 in FIG. 5B, where the two-sided tape 206 is shown to include a polymide film 211 (e.g., Kapton) base having an adhesive layer implemented on each side. Thus, in the example shown, an adhesive layer 213 is shown to engage the stencil 204, and an adhesive layer 212 is shown to be covered by a cover layer 207 (e.g., PET film). Accordingly, the cover layer 207 can be peeled off to expose the adhesive layer 212.

Figure 10A:
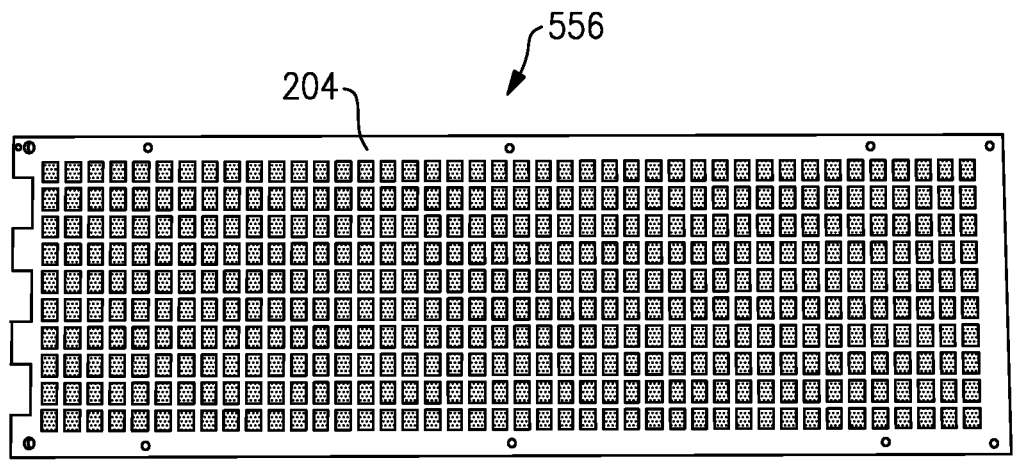
FIGS. 10A and 10B show both sides of an example laminated assembly where a stencil is laminated with a two-sided tape.
Figure 10B:
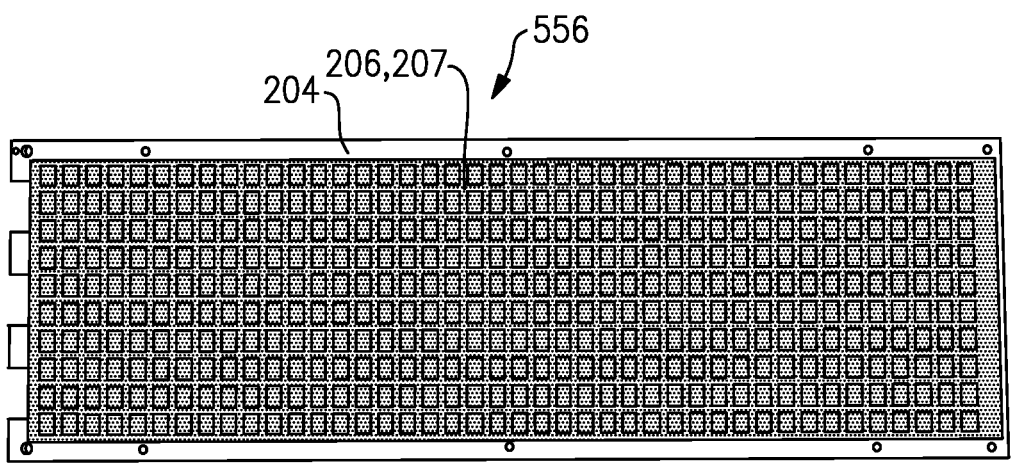

FIGS. 10A and 10B show both sides of an example laminated configuration 556. Such a configuration can correspond to the foregoing configuration 556 of FIG. 5B. More particularly, FIG. 10A shows the side (e.g., underside) opposite from the side where packaged devices will be received. Accordingly, the adhesive layer (213 in FIG. 5B) of the two-sided tape is shown to be exposed through each of the array of openings of the stencil 204. FIG. 10B shows the side (e.g., upper side) where the packaged devices will be received. Accordingly, the two-sided tape 206 with the cover layer 207 is shown to cover each of the array of openings of the stencil 204.

Referring to FIG. 4, the process 520 can further include a block 526 where a laser operation is performed to cut through some or all of the two-sided tape for each opening of the stencil, to yield a first assembly. Such a laser cutting configuration is depicted as 558, where a laser beam 560 is shown to be applied to the two-sided tape 206 to yield cuts 562. As described herein, such application of the laser beam 560 can be achieved in a number of ways. In some embodiments, the laser cutting operation of FIG. 5C can be configured such that the laser beam 560 generally burns through the two-side tape 206, but not completely through the cover layer 207. Thus, when the cover layer 207 is peeled away from the two-sided tape 206, the cut portion of the two-sided tape can remain stuck to the cover layer and thus be removed together.

Referring to FIGS. 6 and 7, a process 530 can include a block 532 where a first assembly as described in reference to FIGS. 4 and 5 can be formed or provided. In FIG. 7A, a configuration 564 resulting from the laser cutting configuration 558 of FIG. 5C is shown to include the first assembly in which laser cuts 562 are formed through the two-sided tape 206, but not through the cover layer 207.

The process 530 can further include a block 534 where the first assembly is mounted to a PVD ring with a tape (e.g., a one-sided tape). In FIG. 7B, such a configuration is depicted as 566, where a tape 568 is shown to be attached to the stencil 204 on the side opposite from the two-sided tape 206. In some embodiments, the tape 568 can be, for example, a one-sided tape.

Figure 11:
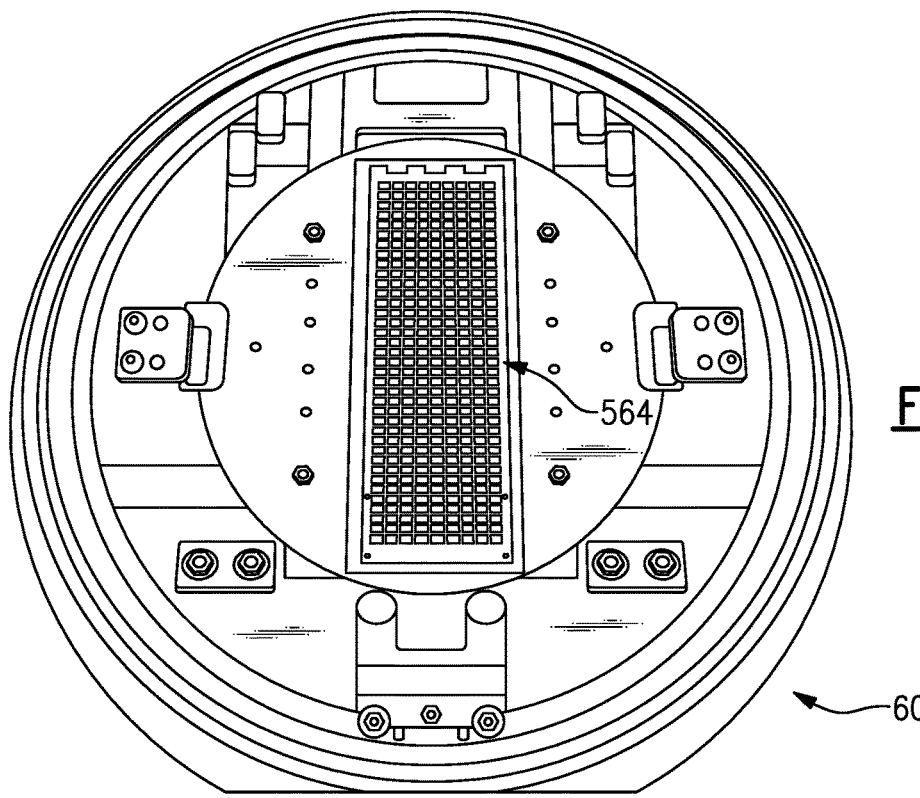
FIG. 11 shows an example where a first assembly similar to that of FIG. 7A is placed on a mounting platform, such that the un-taped surface of the stencil is exposed.
Figure 12:
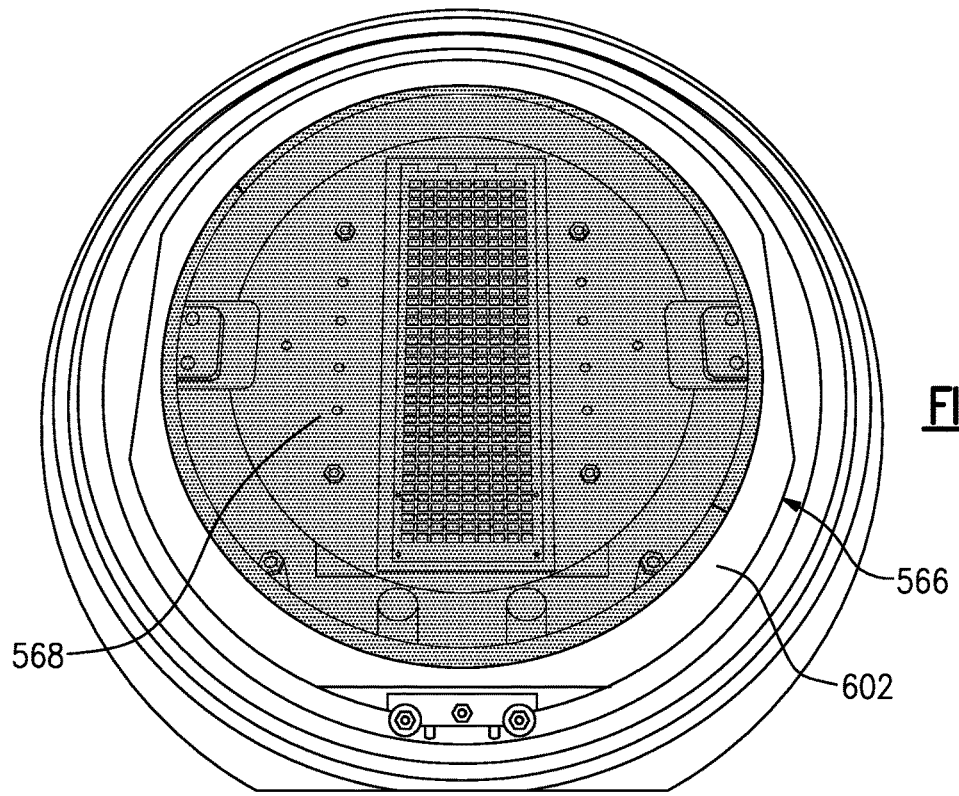
FIG. 12 shows an example where a PVD ring is positioned to encircle the first assembly, and a one-sided tape is positioned over the first assembly and the inner periphery of the PVD ring.
Figure 13:
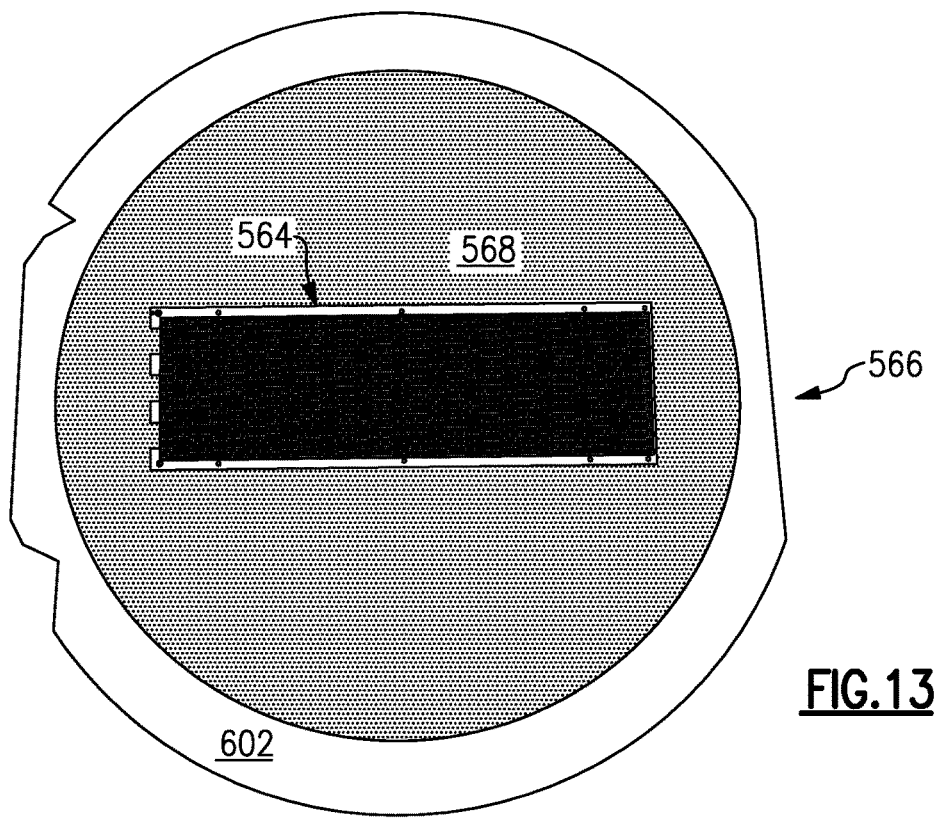
FIG. 13 shows one side of the assembly of the PVD ring, the one-sided tape, and the first assembly resulting from the example operation of FIG. 12.

In some embodiments, such a one-sided tape can extend to a PVD ring to thereby mount the first assembly (564) to the PVD ring. FIGS. 11-13 show an example of how the first assembly 564 can be mounted to such a PVD ring as described in reference to FIGS. 6 and 7B. In FIG. 11, a first assembly 564 similar to that of FIG. 7A is shown to be placed on a mounting platform 600, such that the un-taped surface of the stencil (e.g., the shown surface in FIG. 10A) is exposed. In FIG. 12, a PVD ring 602 is shown to have been positioned to encircle the first assembly 564, and a one-sided tape 568 is shown to be positioned over the first assembly 564 and the inner periphery of the PVD ring 602. Accordingly, the first assembly 564 (now attached to the one-sided tape 568) is shown to be secured to the PVD ring 602 by the tape 568. FIG. 13 shows the other side of the assembly 566 (also 566 in FIG. 7B) of the PVD ring 602, the one-sided tape 568, and the first assembly 564 resulting from the operation of FIG. 12.

Referring to FIGS. 6 and 7, the process 530 can further include a block 536 where a laser operation can be performed to form one or more openings through the one-sided tape to yield a second assembly. FIG. 7C shows an example of such a laser operation 570, where a laser beam 572 is being applied to the one-sided tape 568 to yield cuts indicated as 574. In some embodiments, such a laser cut can be made so that the stencil acts as a backstop to prevent cuts being made at other layer(s). Examples related to such selective laser cuts are described herein in greater detail.

FIG. 7D shows an example of a second assembly resulting from the laser operation of block 536 of FIGS. 6 and 7C. Such a laser operation is shown to result in the opening of the stencil being exposed on the side 577 of the one-sided tape 568. In the context of the examples of FIGS. 11-13, FIG. 14 shows an example of the side 577 of the assembly 564 being exposed from the laser cutting operation as described in reference to FIGS. 6 and 7C. In the example shown, one large opening is made to expose all of the openings of the stencil. It will be understood that other cut patterns can also be implemented. More detailed examples related to such exposure of the stencil openings are described herein in greater detail.

Referring to FIGS. 8 and 9, a process 540 can include a block 542 where a second assembly as described in reference to FIGS. 6 and 7 can be formed or provided. In FIG. 9A, a configuration 576 resulting from the laser cutting configuration 570 of FIG. 7C is shown to include the second assembly in which the stencil opening is formed through the one-sided tape 568.

The process 540 can further include a block 544 where the second assembly can be inverted. Such a process block can also include the cover layer (207 in FIG. 9A) being peeled off of the two-sided tape 206, either before or after the inversion step. In FIG. 9B, such a configuration is depicted as 578, where the peeling of the cover layer 207 has resulted in the laser-cut portion of the two-sided tape 206 (e.g., as in FIG. 5C) being removed, thereby yielding an opening 202 through the two-sided tape 206.

Figure 15:
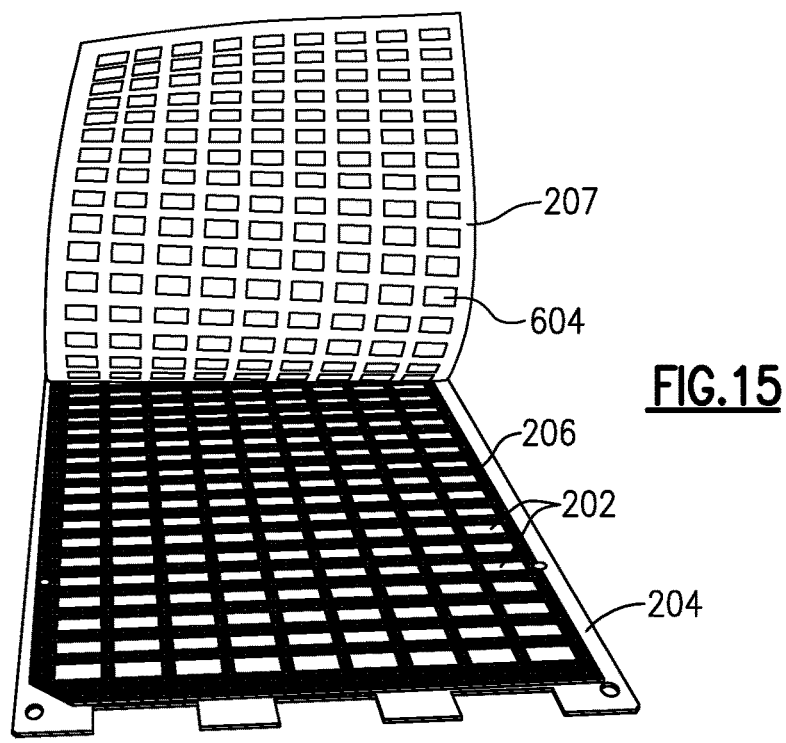
FIG. 15 shows an example of a cover layer being peeled from the two-sided tape that is attached to one side of a stencil.

FIG. 15 shows an example of the cover layer 207 being peeled away from the two-sided tape 206. The cover layer 207 is shown to have stuck to it the laser cut portions 604 of the two-sided tape. Accordingly, the two-sided tape 206 is shown to define an array of openings 202 corresponding to the openings of the stencil 204.

Referring to FIGS. 8 and 9, the process 540 can further include a block 546 where parts are mounted on the two-sided tape to yield a third assembly 580 suitable for a PVD process. In FIG. 9C, such parts are shown to include a packaged device 510 having a box-shaped body and irregular features (e.g., solder balls) on its underside. As described herein, the packaged device 510 can include, for example, a packaging substrate 512 (e.g., a PCB substrate, a laminate substrate, etc.), and an RF component 513 such as a die mounted on the packaging substrate 512. An overmold cap 514 can be formed over the packaging substrate 512 to yield an upper surface of the packaged device 510. In the example context of the packaging substrate 512 having a rectangular footprint shape, the overmold cap 514 and the packaging substrate 512 define four side walls of the packaged device 510. Accordingly, when the packaged device 510 is mounted on the two-sided tape 206 as shown in FIG. 9C, the side walls and the upper surface are exposed to allow deposition of material such as metal to provide RF shielding functionality. The underside of the packaged device 510, including the solder balls 516, are not exposed; thus, is not subjected to the deposition material.

In the example of FIG. 9C, the underside of the packaged device 510 may or may not include an underside-mounted component such as a die. Further, it will be understood that the solder balls 516 are examples of irregular features or topography associated with the example packaged device 510. Such irregular features or topography can include features other than or in addition to the solder balls.

Figure 16:
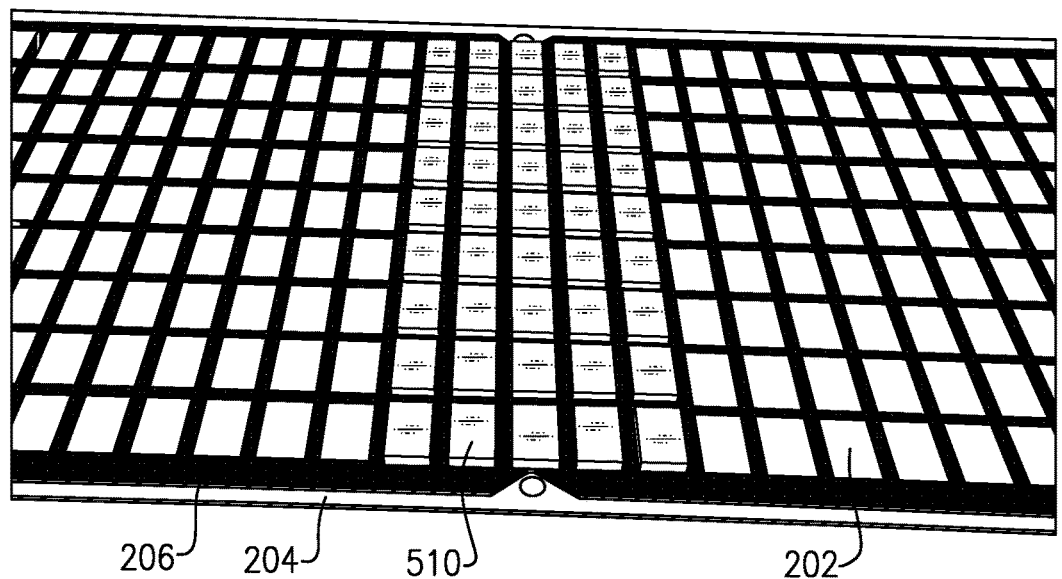
FIG. 16 shows an example where a plurality of packaged devices are mounted onto the exposed two-sided tape which is supported at least partially by the stencil.

FIG. 16 shows an example where a plurality of packaged devices 510 are mounted onto the two-sided tape 206 which is supported at least partially by the stencil 204. As described herein, the openings 202 formed through the two-sided tape 206 can accommodate irregular features such as solder balls associated with the packaged devices 510.

In some embodiments, one or more of the third assemblies of FIGS. 8 and 9C can be loaded onto a PVD apparatus for a deposition process. As described herein, such a deposition process can include, for example, a conformal coating of metal to facilitate RF shielding functionality for a given packaged device.

Figure 14:
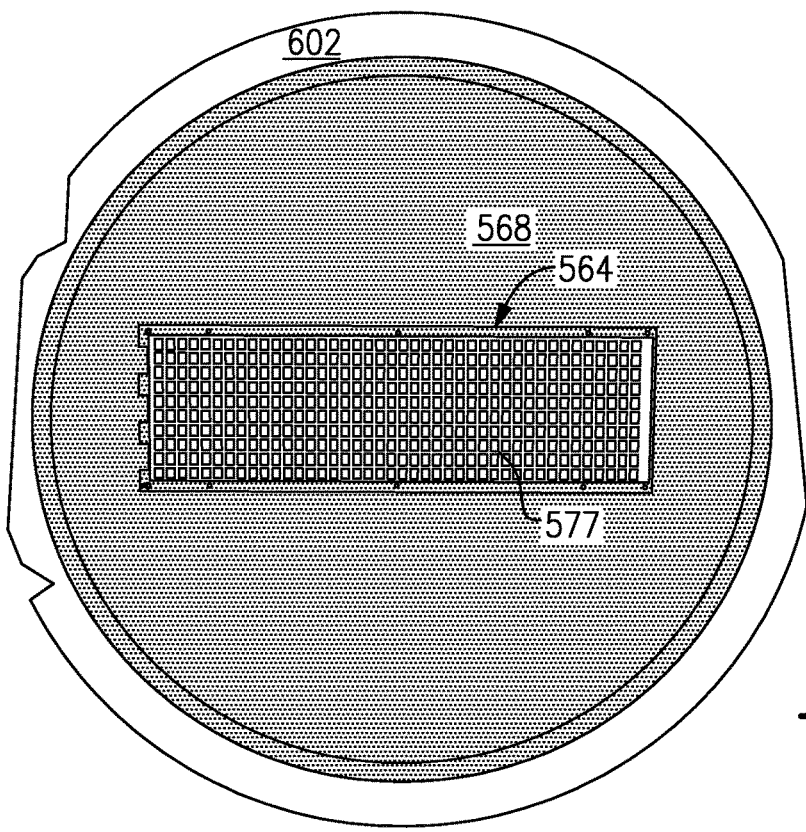
FIG. 14 shows an example where a portion of the other side of the assembly of FIG. 13 is exposed utilizing, for example, a laser cutting operation.
Figure 17:
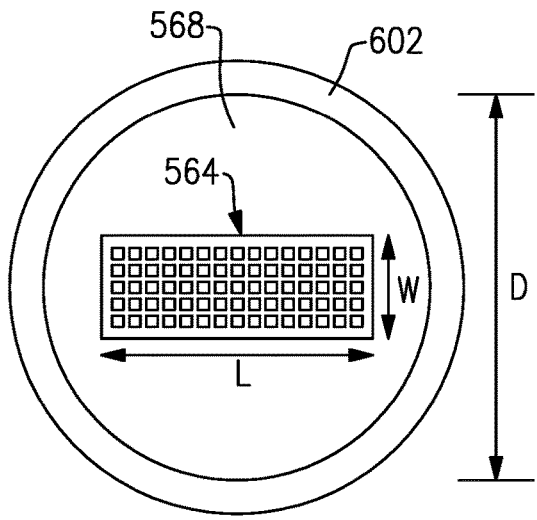
FIG. 17 depicts an assembly similar to the example of FIGS. 13 and 14, where a stencil/two-sided tape assembly is secured to a PVD ring with a tape.

FIG. 17 depicts an assembly similar to the example of FIGS. 13 and 14, where a stencil/two-sided tape assembly 564 is secured to a PVD ring 602 with a tape 568. The stencil is shown to have lateral dimensions of L×W, and the inner diameter of the PVD ring 602 is shown to have a dimension of D. In some embodiments, a laser system utilized for cutting processes (e.g., in FIGS. 5C and 7C) may be better suited for operations within a lateral area defined by the stencil (L×W), than the entire lateral area within the inner diameter of the PVD ring 602. There may also be other processing operations for which the lateral dimensions L×W are more efficient than the larger area within the inner diameter of the PVD ring 602. Thus, one can see that use of an appropriately dimensioned stencil in combination with a PVD ring can provide a number of advantageous features as described herein.

Figure 18:
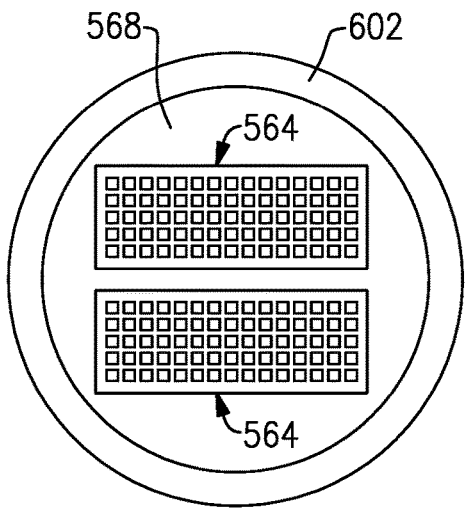
FIG. 18 shows that in some embodiments, more than one stencil/two-sided tape assembly can be secured to a PVD ring with a tape.

In some embodiments, a PVD ring and a stencil may be dimensioned to allow mounting of more than one stencil to the PVD ring. FIG. 18 shows an example where two stencil/two-sided tape assemblies 564 are secured to a PVD ring 602 with a tape 568. It is noted that the stencils in the example of FIG. 18 are not necessarily dimensioned the same as the stencil in the example of FIG. 17. It is also noted that the stencils in the example of FIG. 18 are not necessarily the same among themselves. Accordingly, a number of stencils can be dimensioned appropriately and mounted to a PVD ring as described herein to maximize or increase the efficiency in how space is utilized in the PVD ring.

Figure 19:
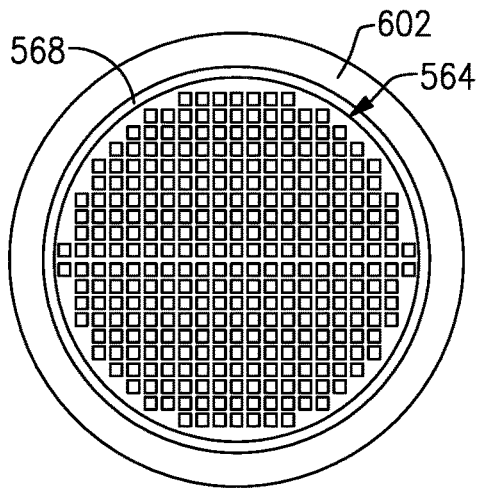
FIG. 19 shows an example where a stencil/two-sided tape assembly is based on a non-rectangular shaped stencil, such as a circular shaped stencil.

In various examples described herein, a stencil is depicted as having a rectangular shape. It will be understood that other shapes can be implemented for a stencil having one or more features as described herein. For example, FIG. 19 shows an example where a stencil/two-sided tape assembly 564 is based on a circular shaped stencil. Such a stencil can be dimensioned to fit within the inner diameter of a PVD ring 602. The stencil/two-sided tape assembly 564 can be secured to the PVD ring 602 with a tape 568 as described herein.

Figure 20:
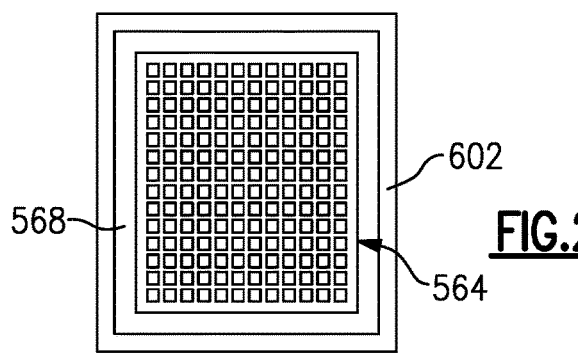
FIG. 20 shows an example where a ring structure for holding a stencil/two-sided tape assembly has a non-circular shape.

In various examples described herein, a PVD ring is depicted as having a generally circular shape to facilitate use in many PVD systems. It will be understood that such a circular shape is an example, and that other shapes can be implemented to accommodate other deposition systems where substrate holders are not necessarily circular. Accordingly, FIG. 20 shows an example where a ring structure 602 for holding a stencil/two-sided tape assembly 564 has a non-circular shape. For example, the ring 602 can have a rectangular shape. In the example of FIG. 20, the stencil/two-sided tape assembly 564 can be secured to the rectangular shaped ring 602 with a tape 568 as described herein.

In various examples described herein, a laser operation can be performed to cut a portion of a one-sided tape from the corresponding stencil. For example, FIGS. 7C, 7D and 14 show such a cut implemented to expose the openings of the stencil. In some embodiments, such openings of the stencil being exposed can facilitate easier handling of packaged devices during one or more process steps involving the stencil.

Figure 21:
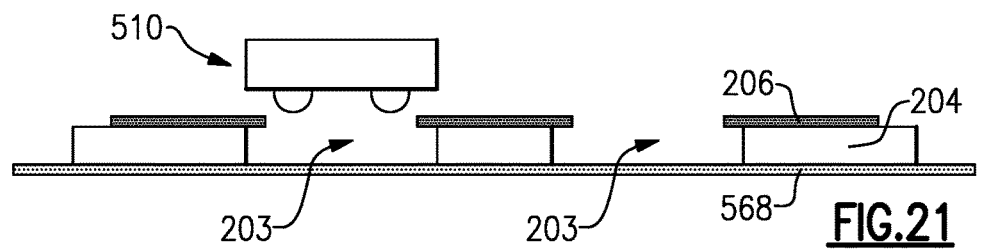
FIG. 21 shows an example configuration where a one-sided tape is implemented on one side of a stencil, and a two-sided tape is implemented on the other side of the stencil.

For example, FIG. 21 shows a configuration where a one-sided tape 568 is implemented on one side of a stencil 204, and a two-sided tape 206 is implemented on the other side of the stencil 204. The one-sided tape 568 is for securing of the stencil 204 to a PVD ring (not shown), and the two-sided tape 206 is for mounting of packaged devices 510 onto the stencil 204 such that irregular features such as solder balls can be accommodated by openings 203 of the stencil 204. In the example of FIG. 21, the 1-sided tape 568 is depicted as not having any opening. In such a configuration, ambient gas such as air can become trapped in the stencil openings 203 as the packaged devices 510 are mounted over the openings 203. Such trapped gas can make various processing steps more difficult. For example, when such an assembly (with packaged devices 510 mounted on the two-sided tape) is heated during steps such as cleaning and curing processes, the gas generally trapped in the openings 203 can expand significantly and cause the packaged devices 510 to become dislodged.

Figure 22:
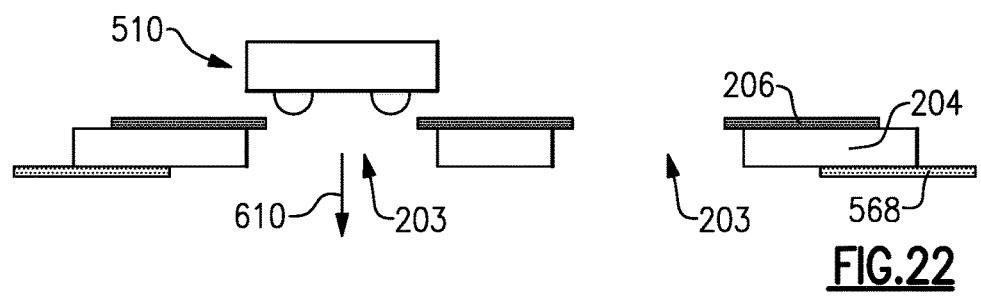
FIG. 22 shows an example configuration similar to the example of FIG. 14, where openings of a stencil are exposed by cutting away an appropriate portion of a one-sided tape.

FIG. 22 shows an example configuration similar to the examples described herein in reference to FIGS. 3D, 9C and 14, where openings 203 of a stencil 204 are exposed by cutting away appropriate portion of a one-sided tape 568. In such a configuration, ambient gas such as air is not trapped in the stencil openings 203 as packaged devices 510 are mounted over the openings 203. For example, any displacement of ambient gas resulting from mounting of the packaged devices 510 can exit (arrow 610) from the openings 203 due to the openings being exposed as a result of the cut made on the one-sided tape 568.

In various examples described herein, the foregoing cut formed on the one-sided tape (568) can expose all of the stencil openings (203). Such a technique can be advantageous, since one laser cutting operation can expose many stencil openings. However, it will be understood that exposing of stencil openings can be implemented in other manners. For example, there can be more than one laser cut, such that each cut results in a group of stencil openings being exposed.

Figure 23:
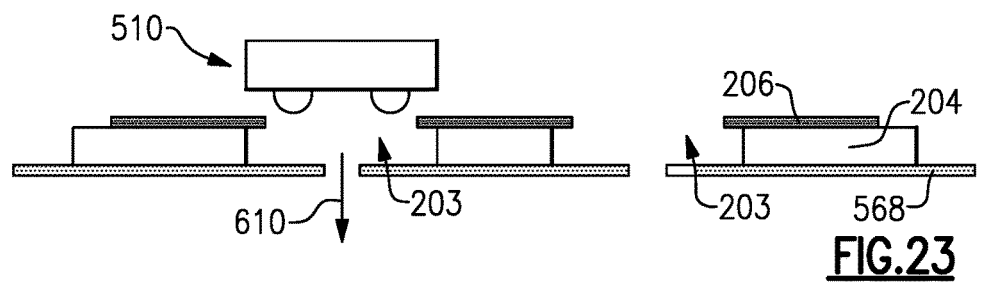
FIG. 23 shows an example where cutting or punching operations can yield openings on the one-sided tape at areas corresponding to the stencil openings.

In another example, each stencil opening can be partially or fully exposed separately from other stencil openings. FIG. 23 shows an example where cutting or punching operations can yield openings on the one-sided tape 568 at areas corresponding to the stencil openings 203. Accordingly, ambient gas can escape (arrow 610) through such openings of the one-sided tape 568 during process steps such as mounting of the packaged devices 510.

In some embodiments, a stencil can be secured to a PVD ring with a given tape, and the same tape can be utilized to hold packaged devices. For example, a two-sided tape having openings for receiving of packaged devices can extend beyond the corresponding stencil and be attached to a PVD ring. In such a configuration, a laser cutting operation can be performed to handle such a two-sided tape.

In some embodiments, and as described herein with various examples, two separate tapes can be utilized, where the first tape (e.g., a two-sided tape) can be implemented for mounting of packaged devices to a stencil, and the second tape (e.g., a one-sided tape) can be implemented to secure the stencil to a PVD ring. In such a configuration, laser cutting operations can involve cutting of the first tape and the second tape. Preferably, cuts made to the first and second tapes are configured such that laser cutting of one tape does not damage the other tape.

Figure 24:
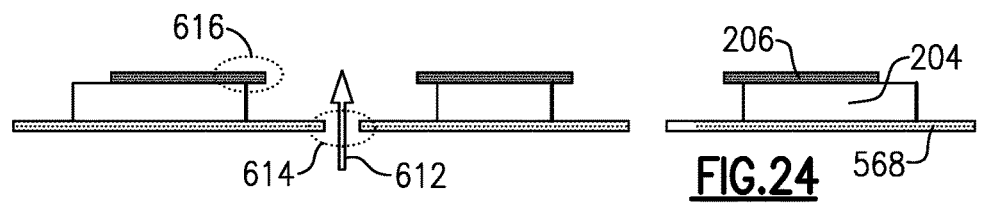
FIG. 24 shows an example cutting operation where a laser beam forms the openings on the one-sided tape of the example of FIG. 23.

For example, and in the context of the configuration of FIG. 23 where cuts are made on the one-sided tape 568 at or near a middle region of each stencil opening 203, FIG. 24 shows a cutting operation where a laser beam 612 forming such a cut (indicated as 614). As one can see, such a laser cut generally will not damage the overhanging portion (indicated as 616) of the two-sided tape 206, since the laser beam 612 is not incident on the two-sided tape 206. It is noted that in the example of FIG. 24, laser cuts for the two-sided tape 206 can be made prior to the application of the one-sided tape 568, so as to avoid the laser beam damaging the one-sided tape 568.

Figure 25:
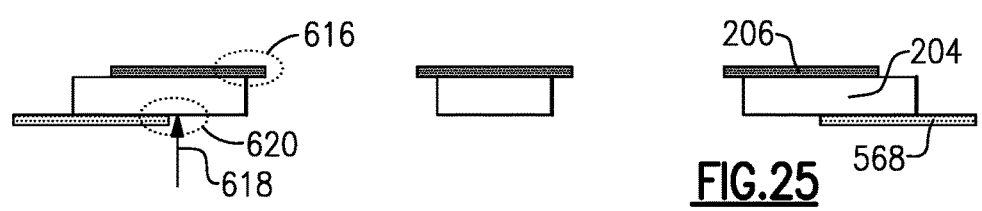
FIG. 25 shows an example cutting operation where a laser beam forms the portion of the one-sided tape of the example of FIG. 22.

In another example, and in the context of the configuration of FIG. 22 where a single large cut is made on the one-sided tape near the periphery of the stencil 204, FIG. 25 shows a cutting operation where a laser beam 618 forming such a cut (indicated as 620) is incident on the stencil itself after cutting through the one-sided tape 568. Accordingly, the two-sided tape 206, including the overhanging portion 616, is shielded from the laser beam 618.

In various examples described herein, a cut pattern on a two-sided tape (for holding of packaged devices) can include an overhang portion (e.g., 616 in FIGS. 24 and 25) relative to each stencil opening. FIGS. 26-29 show examples of how such overhang portions of the two-sided tape can be configured to provide advantageous features during various process steps.

Figure 26:
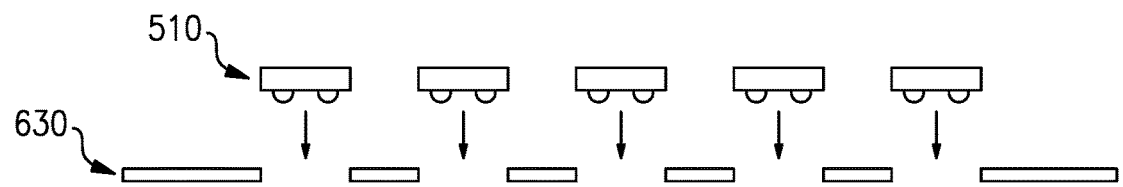
FIG. 26 shows an example process step where a plurality of packaged devices are being loaded onto an assembly that includes a stencil with a two-sided tape, in preparation for a PVD process.

FIG. 26 shows an example process step where a plurality of packaged devices 510 are being loaded onto an assembly 630. For the purpose of description, the assembly 630 can include a stencil and a two-side tape for holding the packaged devices. The assembly 630 may or may not include a one-sided tape on the other side of the stencil. As described herein, the packaged devices 510 being held by the assembly 630 can facilitate a PVD process to form a conformal shielding layer on each packaged device 510.

Figure 27:
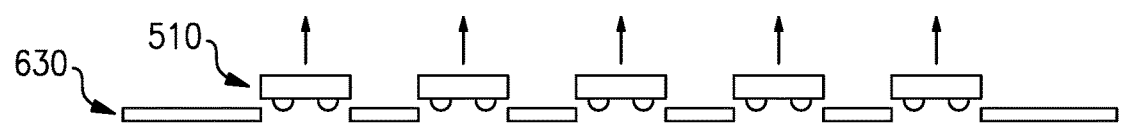
FIG. 27 shows an example process step where the packaged devices are being removed after the PVD process.

FIG. 27 shows an example process step where the packaged devices 510 are being removed after the PVD process. As described herein, the packaged devices 510 being held by the assembly 630 allows the foregoing formation of the conformal shielding layer on the side and upper surfaces of each packaged device 510, while keeping the underside of the packaged device uncoated.

Figure 28:
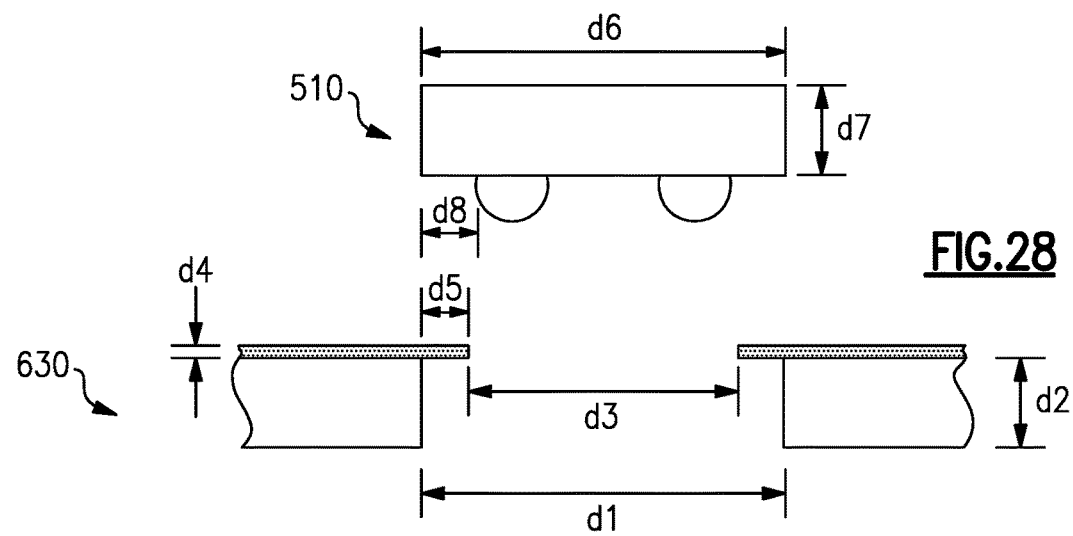
FIG. 28 shows a representative packaged device in relation to a stencil opening with a two-sided tape cut to provide an overhang portion.
Figure 29:
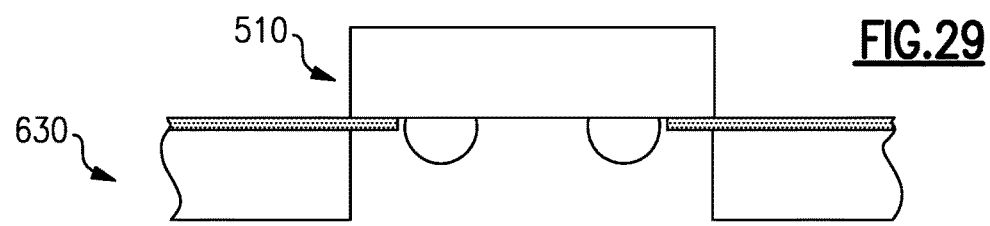
FIG. 29 shows the packaged device mounted on the stencil/two-sided tape assembly, such that one or more underside protrusions such as a ball grid array can be accommodated by the stencil opening.

FIG. 28 shows a representative packaged device 510 in relation to a stencil opening with a two-sided tape cut to provide an overhang portion. Various dimensions associated with the packaged device 510, the stencil opening, and the two-sided tape are indicated as shown. FIG. 29 shows the packaged device 510 mounted on the assembly 630.

In some embodiments, the cut in the two-sided tape can be dimensioned (d3) to be slightly larger than the end-to-end lateral dimension of the solder balls to allow the solder balls to fit through the two-sided tape. Further, some or all of factors such as the lateral dimension of the stencil opening (d1), the edge-to-solder ball dimension of the packaged device (d8), mass of the packaged device, the mechanical property (e.g., bending property) of the two-sided tape, and the amount of overhang (d5) can be utilized to allow the packaged device 510 to be easily mounted onto the assembly 630, and to be easily removed from the assembly 630. For example, an appropriate amount of overhang can allow the packaged device to be cushioned onto the assembly 630, and yet be sufficiently stable without having too much flex in the overhang. Such a mounting configuration can allow the packaged device to be held by the assembly 630 without too much adhesion between the packaged device and the two-sided tape. It is further noted that the foregoing configuration can allow the packaged device 510 to be removed from the assembly 630 easier, due to the appropriate adhesion between the packaged device and the two-sided tape.

While many examples are described herein in the context of PVD-related processes, it will be understood that one or more features of the present disclosure can also be implemented for other types of deposition processes, as well as for non-deposition processes utilized for manufacturing of packaged devices such as RF modules. For example, when an array of devices are to be held in a stable manner and be processed together in a system having a particular substrate holding configuration, one or more features of the present disclosure can be implemented to yield desirable results.

Figure 30:
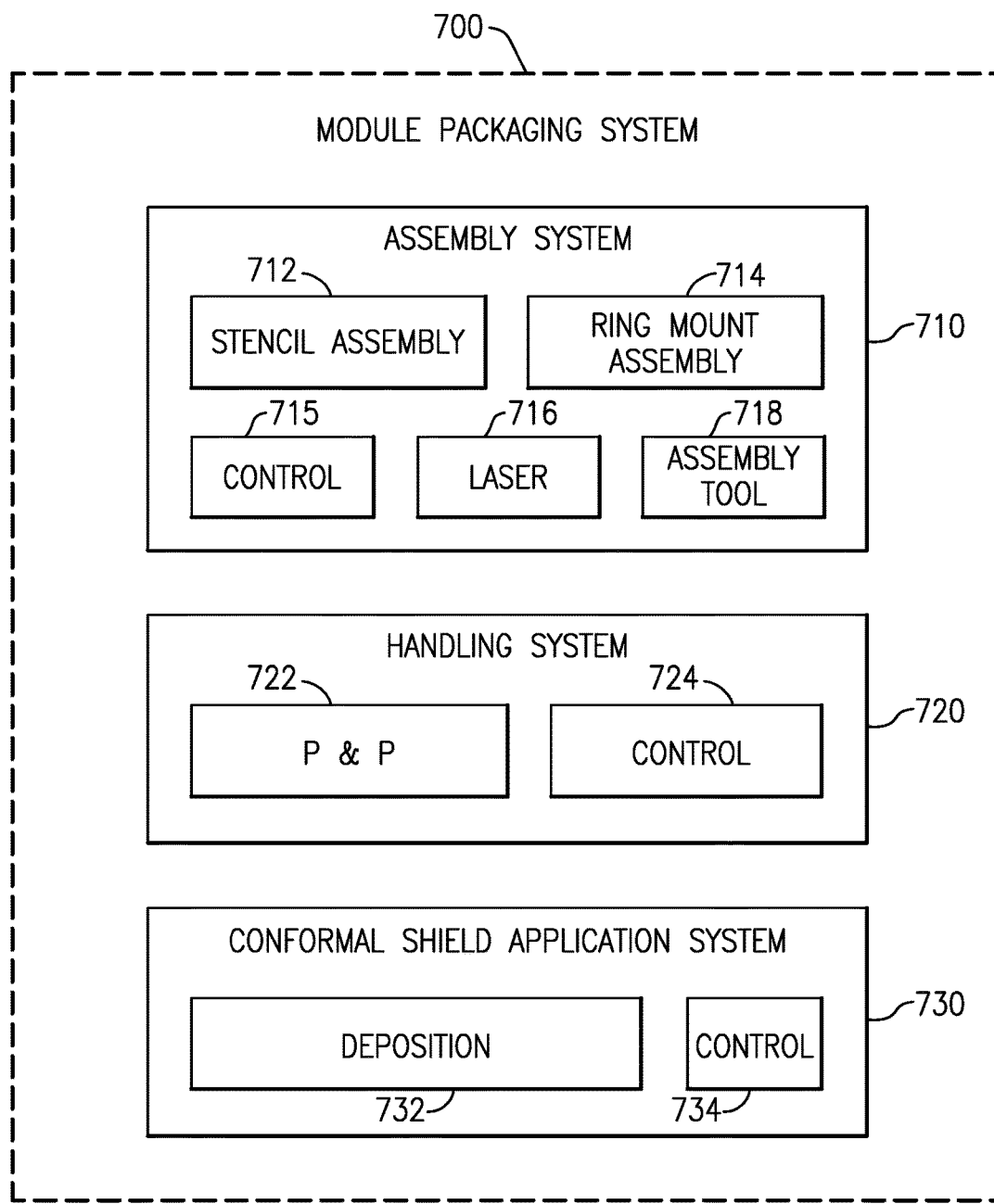
FIG. 30 shows that in some embodiments, one or more features of the present disclosure can be implemented in a module packaging system.

FIG. 30 shows that in some embodiments, one or more features of the present disclosure can be implemented in a module packaging system 700. Such a system can include some or all of an assembly system 710, a handling system 720, and a conformal shield application system 730.

In some embodiments, the assembly system 710 can include, for example, a stencil assembly component 712 configured to facilitate various process steps associated with a stencil. The assembly system 710 can further include a ring mount assembly component 714 configured to facilitate various process steps associated with, for example, a PVD ring.

The assembly system 710 can further include a laser component 716 configured to perform laser cutting operations as described herein. The assembly system 710 can further include an assembly tool component to facilitate, for example, attaching of two-sided and/or one-sided tapes to their respective parts. The assembly system 710 can further include a control component 715 configured to provide control functionality for some or all of the foregoing components.

In some embodiments, the module packaging system 700 can include a handling system 720 having, for example, a pick-and-place apparatus 722 and a control component 724 for controlling such a pick-and-place apparatus.

In some embodiments, the module packaging system 700 can further include a conformal shield application system 730. Such a conformal shield application system can include, for example, a deposition apparatus 732, and a control component 734 for controlling such a deposition apparatus. In some embodiments, the deposition apparatus 732 can be configured as a PVD apparatus.

In various examples described herein, a tape can include an adhesive member having an adhesive layer on either or both sides. Accordingly, a one-sided tape can be a one-sided adhesive member having an adhesive layer on one of the two sides, and a two-sided tape can be a two-sided adhesive member having an adhesive layer on each of the two sides. In the two-sided adhesive member, it will be understood that the two adhesive layers may or may not be similar.

In some embodiments, such an adhesive member or tape can be shaped differently, including overall rectangular and/or circular shapes. Such shapes of the adhesive member/tape can result from, for example, a larger sheet being cut to yield the shaped adhesive member/tape.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A device for processing a plurality of packaged modules, the device comprising:
   a ring having an inner boundary and configured to be utilized in a deposition apparatus;
   a stencil having a first side and a second side, and defining a plurality of openings, each opening dimensioned to receive a portion of a packaged module to be processed from the first side of the stencil;
   a tape that attaches at least some of the second side of the stencil to the ring such that the stencil is positioned at least partially within the inner boundary of the ring, to allow an assembly of the stencil, the tape and the ring to be utilized in the deposition apparatus; and
   a two-sided adhesive member attached to the first side of the stencil, and having a plurality of openings corresponding to the openings of the stencil, each opening of the two-sided adhesive dimensioned to engage an underside of the respective packaged module while allowing the portion of the packaged module to enter the corresponding opening of the stencil, each opening of the two-sided adhesive smaller than the corresponding opening of the stencil such that an edge of the opening of the two-sided adhesive member forms an overhang relative to an edge of the corresponding opening of the stencil.

2. The device of claim 1 wherein the at least some of the second side of the stencil is attached to the ring by the tape such that the stencil and the ring are approximately coplanar.

3. The device of claim 1 wherein the stencil is positioned completely within the inner boundary of the ring.

4. The device of claim 1 wherein the tape is dimensioned to cover at least a portion of the ring.

5. The device of claim 1 wherein the tape is a one-sided tape.

6. The device of claim 1 wherein the tape includes one or more cutouts dimensioned to expose at least a portion of each opening of the stencil on the second side of the stencil to allow ambient gas to escape from the opening of the stencil when the portion of the packaged module is placed therein from the first side of the stencil.

7. The device of claim 6 wherein the one or more cutouts of the tape includes a single cutout that exposes all of the openings of the stencil on the second side of the stencil, the single cutout resulting in the tape holding the second side of the stencil at a perimeter portion of the stencil.

8. The device of claim 7 wherein the single cutout of the tape includes a cut edge at a solid portion of the stencil such that the stencil inhibits damage to the two-sided adhesive member on the first side of the stencil during a cutting operation on the tape from the second side of the stencil.

9. The device of claim 1 further comprising a cover layer over the two-sided adhesive member, the cover layer configured to be removed prior to positioning of the packaged modules onto the two-sided adhesive member.

10. The device of claim 9 wherein the openings of the two-sided adhesive member are configured so that when the cover layer is removed, a cutout of the two-sided adhesive member is removed with the cover layer to thereby provide the corresponding opening of the two-sided adhesive member.

11. The device of claim 1 wherein the ring fully encloses its interior portion.

12. The device of claim 1 wherein the deposition apparatus includes a physical vapor deposition apparatus.

13. The device of claim 1 wherein the stencil is a rectangular shaped sheet, and the openings of the stencil are rectangular shaped openings arranged in an array.

\* \* \* \* \*